United States Patent [19]

Roohparvar et al.

[11] Patent Number: 5,557,576
[45] Date of Patent: Sep. 17, 1996

[54] METHOD AND APPARATUS FOR MONITORING ILLEGAL CONDITIONS IN A NONVOLATILE MEMORY CIRCUIT

[75] Inventors: Frankie F. Roohparvar, Cupertino; Christophe J. Chevallier, Palo Alto, both of Calif.

[73] Assignee: Micron Quantum Devices, Inc., Santa Clara, Calif.

[21] Appl. No.: 506,970

[22] Filed: Jul. 28, 1995

[51] Int. Cl.$^6$ ................................................. G11C 7/00
[52] U.S. Cl. ............................................ 365/218; 365/195
[58] Field of Search ........................... 365/218, 185.29, 365/185.30, 185.33, 195, 194

[56] References Cited

U.S. PATENT DOCUMENTS

5,355,464 10/1994 Fandrich ............................. 365/218
5,414,829  5/1995 Fandrich ............................. 365/218

*Primary Examiner*—A. Zarabian
*Attorney, Agent, or Firm*—Limbach & Limbach L.L.P.

[57] ABSTRACT

A memory chip and method for operating a memory chip, in which one or more nodes are monitored to identify an illegal condition, and a halt signal is asserted in response to the illegal condition. If an illegal condition is identified during a high voltage mode in which high voltage is applied across transistors of the chip, assertion of the halt signal is delayed until the end of the high voltage mode. In response to the halt signal, the chip halts an operation such as a memory cell erase operation. By avoiding halt signal assertion during a high voltage mode, the invention avoids problems (e.g., due to the snap back bipolar effect) which could otherwise result due to switching of transistors of the chip during the process of halting chip operation in the high voltage mode. Preferably, each memory cell of the chip is a nonvolatile memory cell such as a flash memory cell, and the chip includes simple logic circuitry including a flip-flop for generating the halt signal in response to a first signal which indicates that an illegal condition has occurred and a second signal which indicates that the chip is in a low voltage mode.

19 Claims, 8 Drawing Sheets

METHOD AND APPARATUS FOR MONITORING ILLEGAL CONDITIONS IN A NONVOLATILE MEMORY CIRCUIT

BACKGROUND OF THE INVENTION

1. Field of the Invention

The present invention relates to integrated nonvolatile memory circuits (preferably integrated flash memory circuits) which apply high voltage to selected transistors during one or more operating modes (e.g., during various stages of a memory erase operation), monitor one or more selected nodes to detect an illegal condition, and generate a halt signal (for causing the halting or aborting of circuit operation) in response to detection of an illegal condition. The nonvolatile memory circuit of the invention includes logic means for asserting a halt signal in response to an illegal condition, but only following application of a high voltage to components of the circuit (if the illegal condition occurs during application of the high voltage to such components).

2. Description of Related Art

Throughout the specification, including in the claims, the term "connected" is used (in the context of an electronic component being "connected" to another electronic component) in a broad sense to denote that the components are electrically or electromagnetically coupled with sufficient strength under the circumstances. It is not used in a narrow sense requiring that an electrically conducting element is physically connected between the two components.

Nonvolatile memory chips (integrated circuits) are becoming increasingly commercially important. The present invention pertains to a method and apparatus for halting operation of a nonvolatile memory chip in response to detection of an undesired ("illegal") operating condition of the chip. In order to appreciate the invention, it will be helpful initially to describe the structure and normal operating modes of a typical nonvolatile memory chip.

A typical nonvolatile memory chip includes an array of nonvolatile memory cells, each cell comprising a transistor having a floating gate capable of semipermanent charge storage. The current drawn by each cell depends on the amount of charge stored on the corresponding floating gate. Thus, the charge stored on each floating gate determines a data value that is stored "semipermanently" in the corresponding cell.

One particularly useful type of nonvolatile memory chip includes an array of flash memory cells, with each cell comprising a flash memory device (a transistor). The charge stored on the floating gate of each flash memory device (and thus the data value stored by each cell) is erasable by appropriately changing the voltage applied to the gate and source (in a well known manner).

Figure 1:
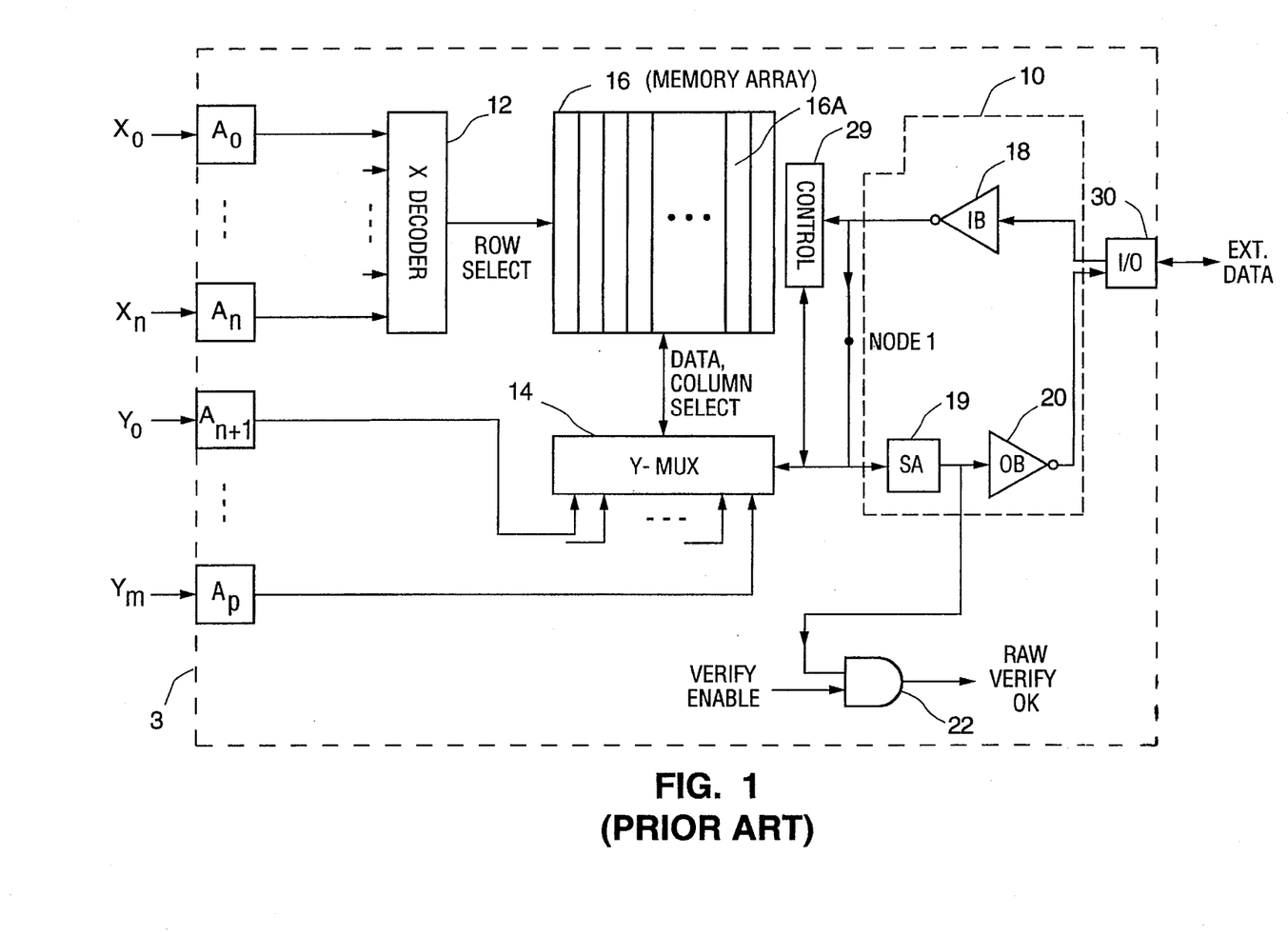
FIG. 1 is block diagram of a conventional memory circuit (implemented as an integrated circuit).

FIG. 1 is a simplified block diagram of a conventional nonvolatile memory chip. Integrated circuit 3 of FIG. 1 includes at least one I/O pad 30 (for asserting output data to an external device or receiving input data from an external device), input/output buffer circuit 10 for I/O pad 30, address buffers A0 through Ap for receiving memory address bits from an external device, row decoder circuit (X address decoder) 12, column multiplexer circuit (Y multiplexer) 14, and memory array 16 (comprising columns of nonvolatile memory cells, such as column 16A). Each of address buffers A0 through Ap includes an address bit pad for receiving (from an external device) a different one of address bit signals X0 through Xn and Y0 through Ym.

2

I/O buffer circuit 10 includes a "write" branch and a "read" branch. The write branch comprises input buffer 18. The read branch comprises sense amplifier 19 and output buffer 20. Chip 3 executes a write operation by receiving data (to be written to memory array 16) from an external device at I/O pad 30, buffering the data in the write branch, and then writing the data to the appropriate memory cell. Chip 3 can also be controlled to execute a read operation in which it amplifies and buffers data (that has been read from array 16) in the read branch, and then assert this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Figure 2:
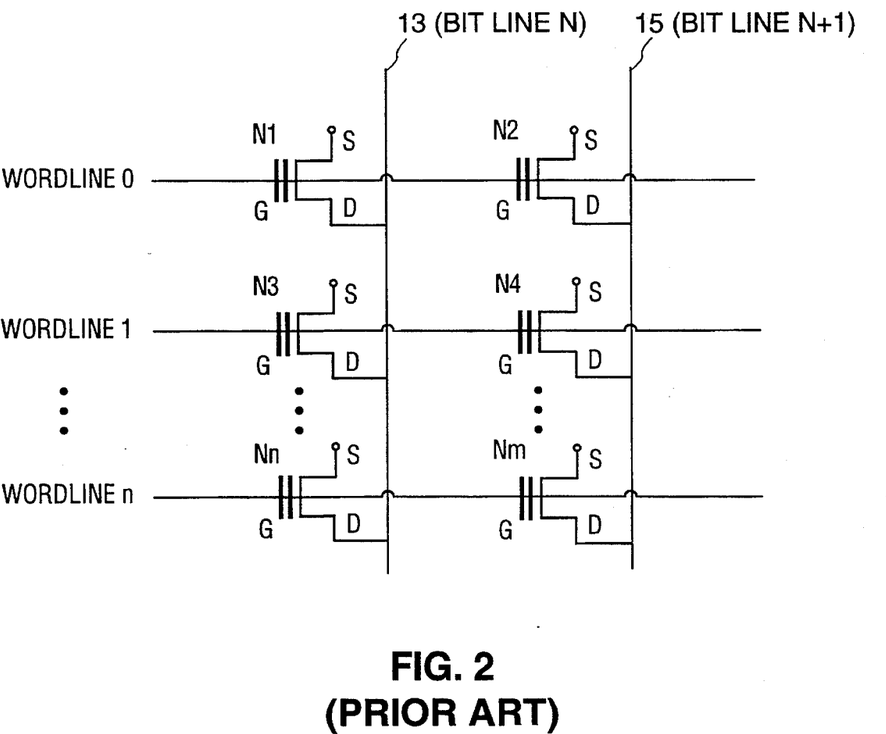
FIG. 2 is a simplified schematic diagram of two columns of memory cells of memory cell array 16 of FIG. 1.

Each of the cells (storage locations) of memory array circuit 16 is indexed by a row index (an 37 X" index determined by decoder circuit 12) and a column index (a "Y" index output determined by decoder circuit 14). FIG. 2 is a simplified schematic diagram of two columns of cells of memory array 16 (with one column, e.g., the column on the right, corresponding to column 16A of FIG. 1). The column on the left side of FIG. 2 comprises "n" memory cells, each cell implemented by one of floating-gate N-channel transistors N1, N3, . . . , Nn. The drain of each of transistors N1–Nn is connected to bitline 13, and the gate of each is connected to a different wordline (a different one of wordline 0 through wordline n). The column on the right side of FIG. 2 also comprises "n" memory cells, each cell implemented by one of floating-gate N-channel transistors N2, N4, . . . , Nm. The drain of each of transistors N2–Nm is connected to bitline 15, and the gate of each is connected to a different wordline (a different one of wordline 0 through wordline n). The source of each of transistors N1, N3, . . . , Nn, and N2, N4, . . . , Nm is held at a source potential (which is usually ground potential for the chip during a program or read operation).

In the case that each memory cell is a nonvolatile memory cell, each of transistors N1, N3, . . . , Nn, and N2, N4, . . . , Nm has a floating gate capable of semipermanent charge storage. The current drawn by each cell (i.e., by each of transistors N1, N3, . . . , Nn, and N2, N4 . . . , Nm) depends on the amount of charge stored on the corresponding floating gate. Thus, the charge stored on each floating gate determines a data value that is stored "semipermanently" in the corresponding cell. In cases in which each of transistors N1, N3, . . . , Nn, N2, N4, . . . , and Nm is a flash memory device (as indicated in FIG. 2 by the symbol employed to denote each of transistors N1, N3, . . . , Nn, N2, N4, . . . , and Nm), the charge stored on the floating gate of each is erasable (and thus the data value stored by each cell is erasable) by appropriately changing the voltage applied to the gate and source (in a well known manner).

In response to address bits Y0–Ym, circuit 14 (of FIG. 1) determines a column address which selects one of the columns of memory cells of array 16 (connecting the bitline of the selected column to Node 1 of FIG. 1), and in response to address bits X0–Xn, circuit 12 (of FIG. 1) determines a row address which selects one cell in the selected column. Consider an example in which the column address selects the column on the right side of FIG. 2 (the column including bitline 15) and the row address selects the cell connected along wordline 0 (the cell comprising transistor N2). To read the data value stored in the selected cell, a signal (a current signal) indicative of such value is provided from the cell's drain (the drain of transistor N2, in the example), through bitline 15 and circuit 14, to node 1 of FIG. 1. To write a data value to the selected cell, a signal indicative of such value is provided to the cell's gate and drain (the gate and drain of transistor N2, in the example).

More specifically, the FIG. 1 circuit executes a write operation as follows. Each of address buffers A0 through An asserts one of bits X0–Xn to decoder circuit 12, and each of address buffers An+1 through Ap asserts one of bits Y0–Ym to decoder circuit 14. In response to these address bits, circuit 14 determines a column address (which selects one of the columns of memory cells of array 16, such as column 16A), and circuit 12 determines a row address (which selects one cell in the selected column). In response to a write command (which can be supplied from control unit 29, or other circuitry not shown in FIG. 1), a signal (indicative of data) present at the output of input buffer 18 is asserted through circuit 14 to the cell of array 16 determined by the row and column address (e.g., to the drain of such cell). During such write operation, output buffer 20 may be disabled. A data latch (not shown) is typically provided between input buffer 18 and I/O pad 30 for storing data (to be written to a memory cell) received from I/O pad 30. When the latched data is sent to input buffer 18, input buffer 18 produces a voltage at Node 1 which is applied to the selected memory cell. Input buffer 18 is typically implemented as a tri-statable driver having an output which can be placed in a high impedance mode (and thus disabled) during a read operation. In some implementations, the functions of the latch and input buffer 18 are combined into a single device.

The FIG. 1 circuit executes a read operation as follows. Each of address buffers A0 through An asserts one of bits X0–Xn to address decoder circuit 12, and each of address buffers An+1 through Ap asserts one of bits Y0–Ym to address decoder circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command (supplied from control unit 29, or from other circuitry not shown in FIG. 1), a current signal indicative of a data value stored in the cell of array 16 (a "data signal") determined by the row and column address is supplied from the drain of the selected cell through the bitline of the selected cell and then through circuit 14 to sense amplifier 19. This data signal is processed in amplifier 19 (in a manner to be described below), and the output of amplifier 19 is buffered in output buffer 20 and finally asserted at I/O pad 30.

When reading a selected cell of array 16, if the cell is in an erased state, the cell will conduct a first current which is converted to a first voltage in sense amplifier 19. If the cell is in a programmed state, it will conduct a second current which is converted to a second voltage in sense amplifier 19 (the "second current" flowing through a programmed cell is negligibly small when the cell is read by a typical, conventional read operation). Sense amplifier 19 determines the state of a cell (i.e., whether it is programmed or erased corresponding to a binary value of 0 or 1, respectively) by comparing the voltage indicative of the cell state to a reference voltage. The outcome of this comparison is an output which is either high or low (corresponding to a binary value of one or zero) which sense amplifier 19 sends to output buffer 20, which in turn asserts a corresponding data signal to I/O pad 30 (from which it can be accessed by an external device).

Nonvolatile memory chip 3 of FIG. 1 can also execute an erase operation in which all or selected ones of the cells of memory array 16 are erased in response to a sequence of one or more commands (e.g., an "Erase Setup" command followed by an "Erase Confirm" command), by discharging a quantity of charge stored on the floating gate of each cell. Typically, all cells of array 16 or large blocks of such cells are erased at the same or substantially the same time during an erase operation. Each erase operation comprises a sequence of steps, including "verification" steps for verifying that the cells have desired threshold voltages at each of one or more stages of the erase operation.

More specifically, if cells of memory array 16 of FIG. 1 are to be erased, an "Erase Setup" command and then an "Erase Confirm" command are sent from an external device to I/O pad 30. Where each such command comprises parallel bits, the different bits are sent in parallel to I/O pad 30 and to additional I/O pads identical to I/O pad 30. The command is transferred from I/O pad 30 (or from I/O pad 30 and additional I/O pads) to input buffer 18 (or input buffer 18 and input buffers connected to the other I/O pads), and then to control unit 29. Control unit 29, which typically includes command execution logic and a state machine, processes the command to generate instruction data, and supplies the instruction data to circuit 14 and sense amplifier 19 (and to other components of memory chip 3 of FIG. 1) to cause chip 3 to execute a sequence of steps required for erasing the specified cells of array 16. These steps include verification steps (e.g., the verification step discussed below with reference to FIG. 5) for verifying that one or more of the cells have desired threshold voltages at each of one or more stages of the erase operation.

During each verification step, verification data (denoted as "RAW VERIFY OK" in FIG. 1) is output from AND gate 22 (in response to the output of sense amplifier 19). This verification data can be fed back to control unit 29. Typically, an external device polls output pads of chip 3 in order to determine whether the erase operation has been completed and whether the erase operation was successful.

More specifically, during verification, the output of sense amplifier 19 is "Anded" with a verification enable signal. I.e., the output of sense amplifier 19 is supplied to one input of AND gate 22, verification enable signal "VERIFY ENABLE" is supplied to the other input of AND gate 22, and the AND gate 22 outputs the signal "RAW VERIFY OK" The signal RAW VERIFY OK is asserted to a state machine (e.g., a state machine within control unit 29) to trigger execution of the next chip operation. The level of signal VERIFY ENABLE is a logical "1" only during each verification cycle. Thus, if the sense amplifier output becomes valid (i.e., a logical "1") at any instant during a verification operation, the signal RAW VERIFY OK is a logical "1" at a corresponding instant (and this instantaneous value of RAW VERIFY OK can cause the state machine to trigger execution of the appropriate chip operation).

Figure 3:
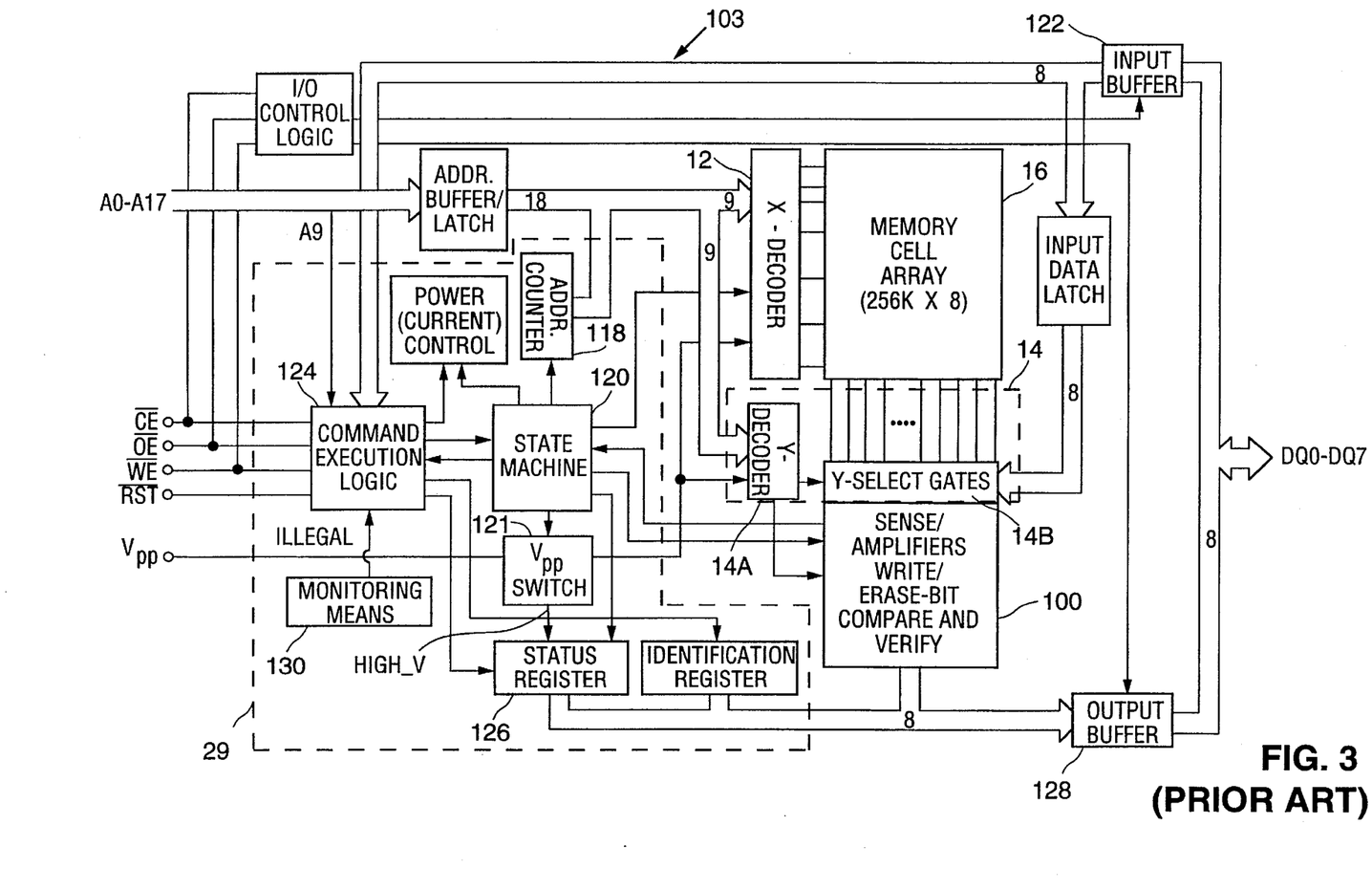
FIG. 3 is a block diagram of a conventional flash memory system.

A conventional memory erase operation is next described in greater detail with reference to FIG. 3. FIG. 3 is a block diagram of a conventional flash memory integrated circuit 103 (also referred to herein as "system" 103) which is a variation on memory chip 3 of FIG. 1 which performs the same functions as does chip 3. The components of flash memory system 103 which correspond to components of memory chip 3 of FIG. 1 are identified by the same reference numerals as in FIG. 1. Memory array 16 of system 103 consists of flash memory cells arranged in rows and columns with there being a total of 256K of eight bit words in the array. The individual cells (not depicted) are addressed by eighteen address bits (A0–A17), with nine bits being used by X decoder circuit 14 to select the row of array 16 in which the target cell is located and the remaining nine bits being used by Y decoder circuit 14A (of Y-multiplexer 14) to select the appropriate columns of array 16.

Internal state machine 120 (a component of control unit 29 of system 103) controls detailed operations of system 103 such as the various individual steps necessary for carrying out cell programming, reading and erasing operations. State machine 120 thus functions to reduce the overhead required of the processor (not depicted) typically used in association with system 103.

In order for memory array 16 to be erased (typically, all or large blocks of the cells are erased at the same time), the processor must cause Output Enable ($\overline{OE}$) pin to be inactive (high), and Chip Enable ($\overline{CE}$) pin and Write Enable ($\overline{WE}$ or "–WE") pin to be active (low). The processor can then issue an 8 bit command 20H (0010 0000) on data I/O pins DQ0–DQ7, typically called an Erase Setup command (one of I/O pins DQ0–DQ7 corresponds to I/O pad 30 of FIG. 1). This is followed by issuance of a second eight bit command D0H (1101 0000), typically called an Erase Confirm command. Two separate commands are used so as to minimize the possibility of an inadvertent erase operation.

The commands are transferred to data input buffer 122 (input buffer 18 of FIG. 1 corresponds to a component of buffer 122 which receives one bit of each command) and the commands are then transferred to command execution logic unit 124. Logic unit 124 then instructs state machine 120 to perform all of the numerous and well known steps for erasing array 16. Once the erase sequence is completed, state machine 120 updates an 8 bit status register 126, the contents of which are transferred to data output buffer 128 which is connected to data I/O pins DQ0–DQ7 of the memory system (output buffer 20 of FIG. 1 corresponds to a component of buffer 128 which receives one bit from register 126). The processor will periodically poll the data I/O pins to read the contents of status register 126 in order to determine whether the erase sequence has been completed and whether it has been completed successfully.

Figure 4A:
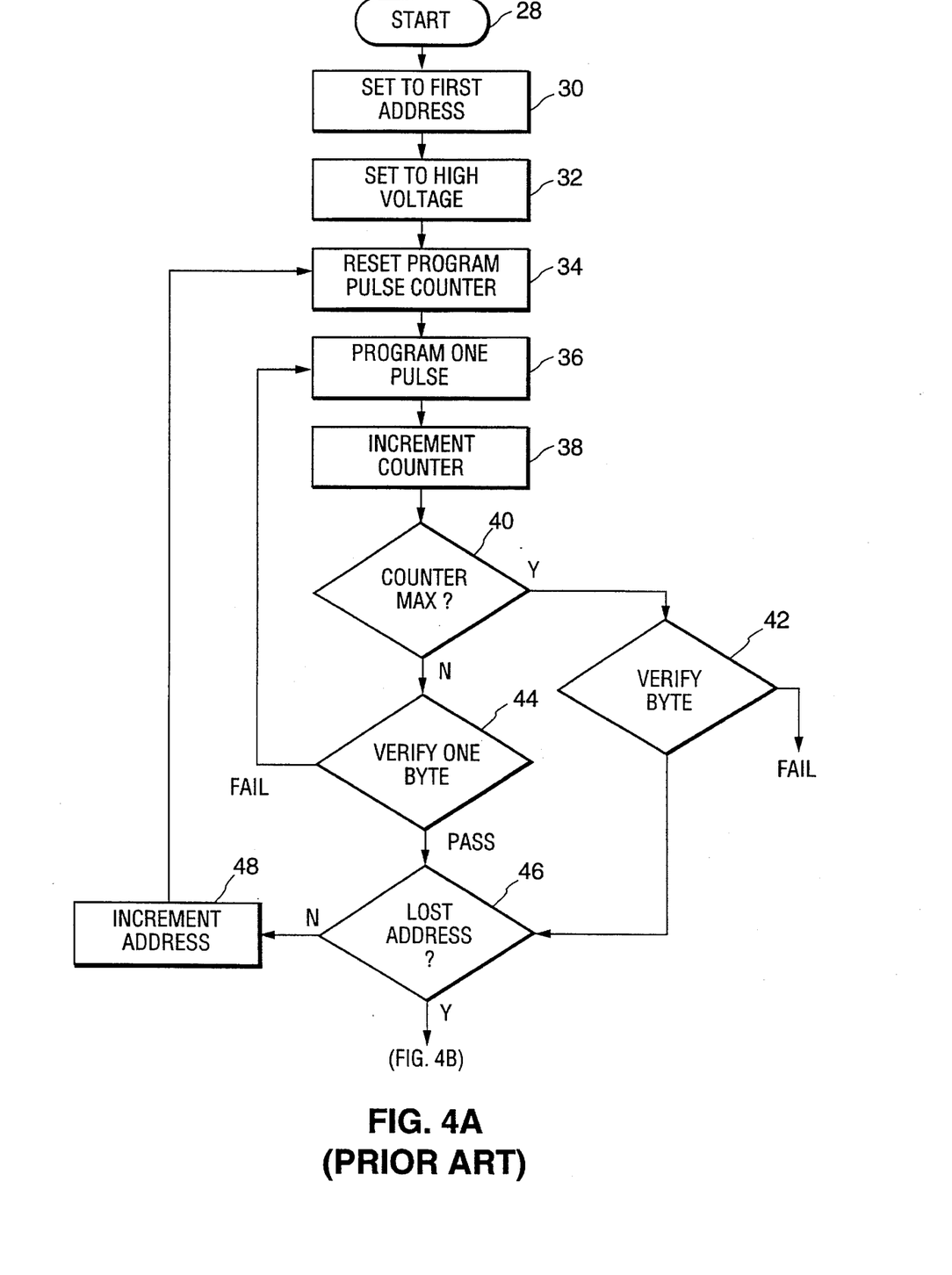
FIGS. 4A and 4B are a flow chart showing a typical memory erase sequence for a conventional flash memory system.
Figure 4B:
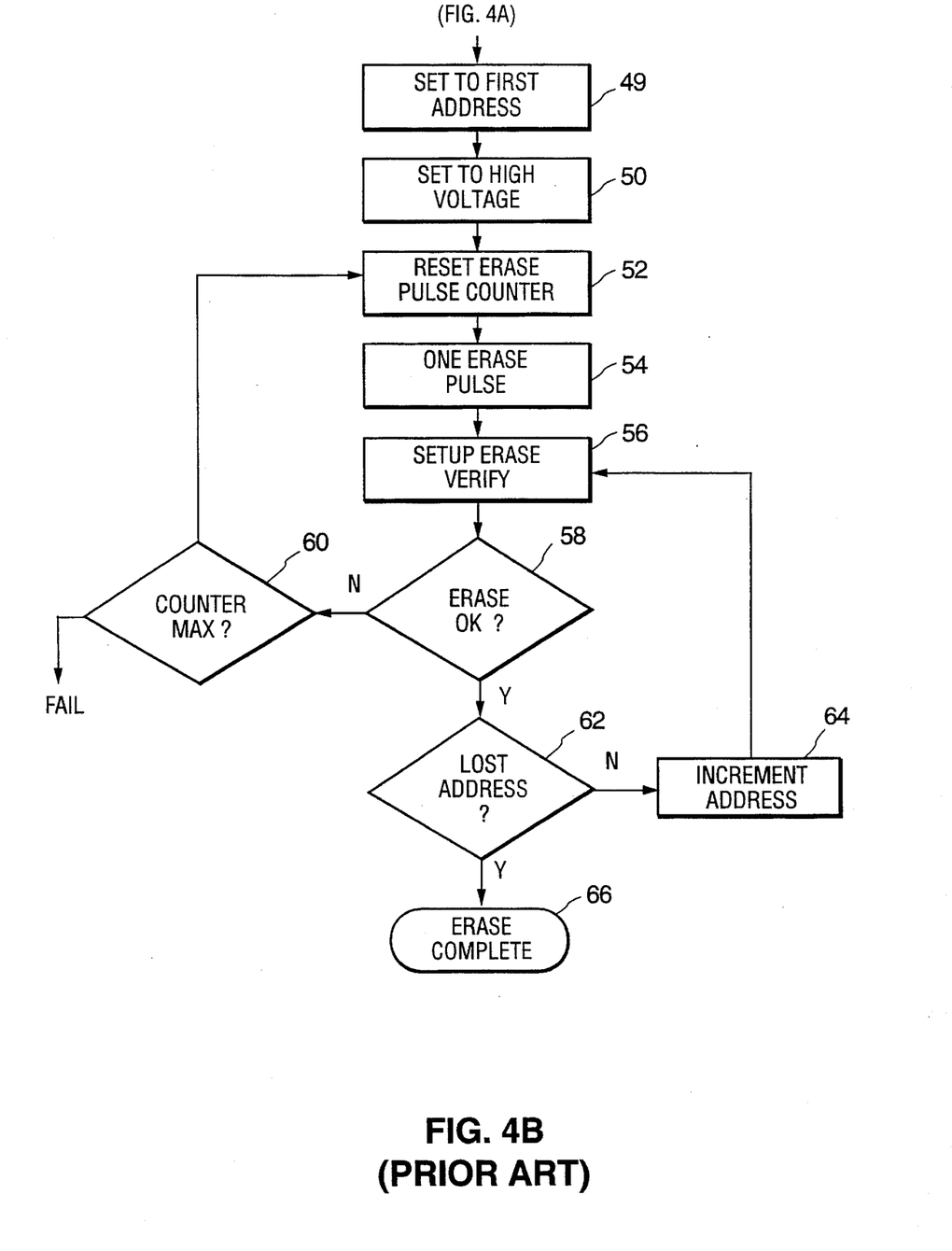

FIGS. 4A and 4B are a flow chart showing a typical erase sequence as it is carried out by state machine 120. It should be noted that during any erase operation, there is a possibility that one or more cells of array 16 will become what is termed "overerased". The objective of the erase sequence is to erase all the cells of array 16 so that the threshold voltages are all within a specified voltage range. That range is typically a small positive voltage range such as +1.5 to +3.0 volts. If the erased cells fall within this range, the cell to be read (the "selected" or "target" cell) will produce a cell current in a read operation. The presence of cell current flow indicates that the cell is in an erased state (logic "1") rather than a programmed state (logic "0"). Cell current is produced in an erased cell because the voltage applied to the control gate of the cell, by way of the word line from the array connected to X decoder 12, will exceed the threshold voltage of the erased cell by a substantial amount. In addition, cells which are not being read ("deselected" cells) are prevented from producing a cell current even if such cells have been erased to a low threshold voltage state. By way of example, for cells located in the same row as the selected cell, by definition, share the same word line as the selected cell. However, the drains of the deselected cells will be floating thereby preventing a cell current from being generated. Deselected cells in the same column will not conduct cell current because the word lines of such deselected cells are typically grounded. Thus, the gate-source voltage of these cells will be insufficient to turn on these deselected cells even if they are in an erased state.

Once array 16 has been erased, the vast majority of its cells will have a proper erased threshold voltage. However, it is possible that a few (or even one) of the cells may have responded differently to the erase sequence and such cell(s) have become overerased. If a cell has been overerased, the net charge on the floating gate will be positive. The result will be that the threshold voltage will be negative to some extent. Thus, when the word line connected to such overerased deselected cell is grounded, the deselected cell will nevertheless conduct current. This current will interfere with the reading of the selected cell thereby preventing proper memory operation. A principal objective of the erase sequence of FIGS. 4A and 4B is to prevent the overerase condition from occurring.

With reference again to the FIG. 4A and 4B flow chart, the erase sequence is initiated (step 28) by the issuance of the two above-noted erase commands. Once the commands have been received by command execution logic 124 (shown in FIG. 3), state machine 120 will first cause all cells of array 16 to be programmed. This is done so that all cells are in essentially the same condition when they are subsequently erased, which reduces the likelihood that one or more of the cells will become overerased since all of the cells will have an increased tendency to respond to the subsequent erase sequence in the same manner. After step 28, an address counter (component 118 of FIG. 3) is initialized (as indicated by block 30) to the first address of the memory. Next, as indicated by block 32, the voltages used for programming are set to the proper level (including by providing high voltage Vpp, e.g. equal to +12 volts, from Vpp switch 121 of FIG. 3 to X and Y decoders 12 and 14A and other components of FIG. 3).

When switch 121 is in a state in which it provides high voltage Vpp to X decoder 12, Y decoder 14A, and other components of FIG. 3, the signal "High V" output from switch 121 is at a high (logical "one") level. Otherwise, the signal "High V" output from switch 121 is at a low (logical "zero") level.

Once the voltages are set, an internal program pulse counter (not depicted) is initialized as shown by block 34 of FIG. 4A. This counter will keep track of the number of programming pulses that have been applied to the cells of the word (byte) being programmed. Next, a programming pulse is applied to the cells of the word located at the first address of the memory, as indicated by block 36. The pulse counter is then incremented (block 38) and a determination is made as to whether a predetermined maximum number of pulses have been applied to the cells (block 40). If that is the case, the cells are read to determine whether the cells have, in fact, been programmed (verification operation 42). This is accomplished using sense amplifiers and associated components represented by block 100 of FIG. 3.

If the cells are still not programmed at this point, there has been a failure since he maximum number of programming pulses has been exceeded. Depending upon the particular memory, the sequence will be terminated or a record of the failed word will be made and the sequence continued. This information will then be transferred to status register 126 (FIG. 3) so that it can be read by the processor. One potential cause of such a failure is that the memory endurance may have been exceeded. In other words, the memory has been cycled too many times.

Assuming that the maximum count has not been exceeded, the byte is verified as indicated by operation 44. If the byte has not been programmed, a further programming pulse is applied (block 36) and the counter is incremented (block 38). Assuming that the maximum count has still not been exceeded, the byte is again verified (operation 44). This sequence will continue until the byte finally passes the verification test or until the pulse counter is at the maximum.

Assuming that the first byte is eventually successfully programmed, a determination is made as to whether the last address of array 16 has been programmed (step 46). If that is not the case, address counter 118 (of FIG. 3) is incremented to the second address (block 48) and the internal pulse counter reset (block 34). A first programming pulse is applied to the byte of the second address (block 36) and the sequence is repeated. This process will continue until all cells of array 16 have either been programmed or until a determination is made that there is a programming failure.

Assuming that all of the cells have been successfully programmed and verified, state machine 120 will continue the erase sequence by setting the appropriate voltages used for erasing, including the initialization of the address counter 118 (block 49 of FIG. 4B) and the setup of the appropriate voltages for erasing, including voltage Vpp (block 50).

Next, an internal erase pulse counter is reset (block 52) and a single erase pulse is applied (block 54) to all of the cells of array 16 (or to the block of the array being erased in the event that capability is provided). The cells of array 16 will then be sequentially read (erase verification step 58) in order to determine whether all cells have been successfully erased. Before step 58, the conditions necessary for erase verification, namely those for cell reading, are set up (block 56) and the first cell of array 16 is read.

A single erase pulse is almost never sufficient to accomplish an erasure so that the test (step 58) will almost always fail. The state of the erase pulse counter is then examined (step 60) and a determination is made that the maximum count has not been exceeded. Accordingly, a second erase pulse is applied to the entire array 16 (step 54) and the first byte is again tested (step 58).

Once the byte has received a sufficient number of erase pulses and has passed the verification test (step 58), the address is incremented (block 60) and the second byte is tested (steps 56 and 58) to determine whether the second byte has been successfully erased. Since the cells are not always uniform, it is possible that the second byte has not be erased even though it has received the same number of erase pulses received by the first byte. In that event, a further erase pulse is applied to the entire array 16 and the second byte is again tested for a proper erase. Note that the address is not reset at this point since it is not necessary to retest those bytes that have already been erased. However, there is a possibility that those earlier erased bytes will become over-erased, as will be explained.

Once it has been established that the second byte has been properly erased, a determination is made as to whether the last address of array 16 has been verified (step 62). If that is not the case, address counter 118 is incremented (step 64) and the third byte is tested. Additional erase pulses will be applied if necessary. The internal erase pulse counter (step 60) will monitor the total number of erase pulses applied in the erase sequence. If a maximum number has been exceeded, the sequence will be terminated and one of the bits of status register 126 will be set to reflect that an erase error has occurred.

Assuming that the second byte of cells has been properly erased, the remaining bytes will be verified and any necessary additional erase pulses will be applied. Once the last address has been verified, the erase sequence is ended and status register 126 is updated to indicate that the erase sequence has been successfully completed.

With reference again to FIG. 3 (and to FIG. 5), memory chip 103 includes a conventional circuit 130 (shown in FIG. 3) for monitoring the status of one or more nodes of the chip. In response to detecting a condition which requires that the normal operational flow of the state machine be stopped (denoted below as an "illegal" condition), monitoring circuit 130 asserts a signal (labeled "ILLEGAL" in FIG. 3) having a high level (a logical "one") to command execution logic 124. In the absence of an illegal condition, the signal "ILLEGAL" is at a low level (a logical "zero"). In response to a high level of the signal "ILLEGAL," logic unit 124 (and in particular, logic circuitry 124A shown in FIG. 5 within unit 124) generates a halt signal (labeled "HALT" in FIG. 5) for causing the halting of circuit operation). Conventional logic circuitry 124A is typically implemented using combinational logic. Logic unit 124 asserts the halt signal to state machine 120 and optionally also to other components of chip 103. In response to the halt signal, state machine 120 halts (aborts or otherwise stops) any ongoing memory erase operation.

However, a problem can arise as a result of the described conventional technique for halt signal generation. This problem occurs when the halt signal is generated at a time when high voltage (e.g., voltage $V_{pp}$) is applied across the source and drain of one or more transistors of the FIG. 3 chip.

It is well known that many typical transistors (e.g., most MOSFET transistors) can withstand high voltage (e.g., 12 volts) across their terminals. However, when a circuit attempts to switch a typical transistor (e.g., a typical NMOS or PMOS transistor) which is a component thereof by changing the voltage on the transistor's gate while a high voltage is applied across its source and drain, the well-known (and undesirable) phenomenon known as the "snap back bipolar" effect can disrupt operation of the circuit, and can also damage the transistor being switched.

For convenience, the phrase "high voltage mode" is used below to denote an operating mode of a nonvolatile memory chip in which high voltage is applied across source and drain terminals of one or more transistors of the chip (where such "high voltage" is sufficiently high to subject the transistors to the snap back bipolar effect if gates of such transistors are switched with the high voltage across their source and drain terminals). An example of such a "high voltage" is the below-discussed voltage $V_{pp}$ (equal to 12 volts) which is sometimes applied across PMOS or NMOS transistors within X decoder circuit 12 of FIG. 3, which voltage is much greater than the supply voltage ($V_{cc}$=5.0 volts or $V_{cc}$=5.5 volts) applied across the terminals of the same transistors during reads of data from memory cells of the same chip.

Also for convenience, the phrase "low voltage mode" (with reference to the same nonvolatile memory chip and the same transistors as in the definition of "high voltage mode") is used below to denote an operating mode of the chip in which "low voltage" is applied across the same terminals of the same transistors (where "low voltage" denotes a voltage, substantially lower than a "high voltage" applied across the terminals in a high voltage mode, and thus sufficiently low so as not to subject the transistors significantly to the snap back bipolar effect if the transistors are switched with the low voltage across their terminals). A typical value of "low voltage" is a supply voltage, $V_{cc}=5.5$ volts, applied across the terminals of the transistors during reads of data from memory cells of the chip (where a high voltage of 12 volts is applied across the terminals of the transistors during a high voltage mode). In the example of the previous sentence, the operation of reading data from the memory cells (with $V_{cc}=5.5$ volts applied across the terminals of the transistors) is a "low voltage mode" of the chip.

Figure 8:
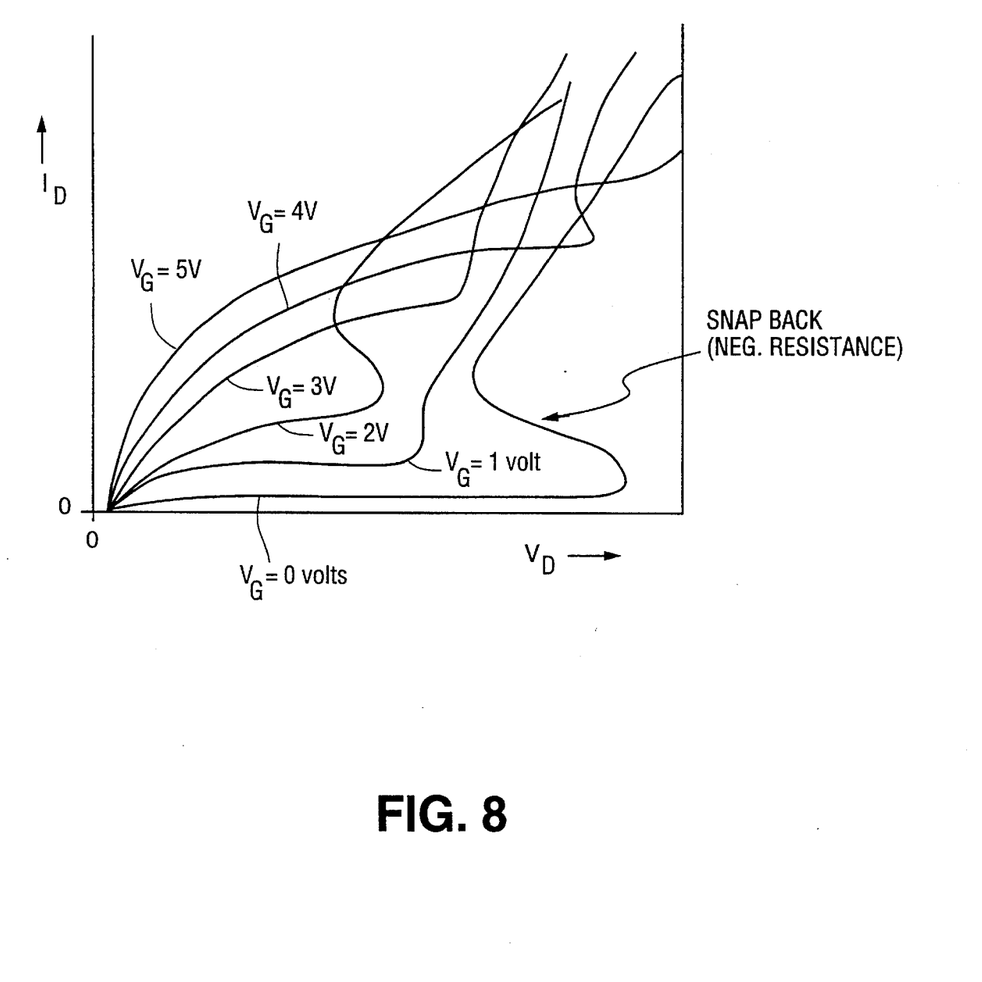
FIG. 8 is a graph of a family of "drain current" v. "drain voltage" curves for a MOS transistor, which illustrates the snap back bipolar effect.

The above-mentioned snap back bipolar effect occurs because of a bipolar effect on a MOS device. This effect is an avalanche hole generated phenomenon which can occur in relatively short channel devices. As source-to-drain separation is reduced, some hole current can flow to the source. If the drain voltage is low, most hole current flows out the substrate terminal. However, with large drain voltages, a substantial hole current can flow to the source, and the product of current flow and substrate resistance becomes large enough (e.g., 0.6 volts) to forward bias the source-substrate junction, thereby causing electron injection into the substrate from the source. This injection leads to an "n-p-n" (source-substrate-drain) bipolar transistor action or a snap back phenomenon. The emitter-base junction of the transistor is self biased. Any current across the reverse-biased collector-base junction is multiplied by current gain β of the bipolar transistor. With reference to FIG. 8 (which shows a family of "drain current" v. "drain voltage" curves, each curve for a different indicated value of gate voltage), this current multiplication results in both a negative resistance characteristic and lower voltage of the $BV_{CEO}$.

If a halt signal of the type described above is generated during a high voltage mode of the FIG. 3 chip, at least some NMOS or PMOS transistors (having high voltage across their sources and drains) will be switched in the course of the chip's response to the halt signal. As a result, the snap back bipolar effect will not only disrupt operation of the chip, but may also damage each transistor that is switched during the high voltage mode with high voltage applied across its terminals.

One possible solution to this problem (the problem of damage and disruption due to switching one or more transistors during a high voltage mode) is to ignore any illegal condition and avoid generating any halt signal during a high voltage mode. However, it is impractical to implement this "solution" in a nonvolatile memory chip for the following reason.

During almost the entire duration of a memory erase operation of a nonvolatile memory chip (in which memory array cells of the chip are erased), the chip is in a high voltage mode. More specifically, as described above with reference to FIGS. 4A and 4B, an erase operation includes setup steps (such as steps 30, 32, and 34 of FIG. 4A and steps 49, 50, and 52 of FIG. 4B), programming and erasing steps (step 36 of FIG. 4A and step 54 of FIG. 4B), and verification steps (such as steps 42 and 44 of FIG. 4A and steps 56 and 58 of FIG. 4B). The chip is in a high voltage mode during the programming and erasing steps, and these steps typically consume almost the entire duration of an overall erase operation (programming step 36 typically requires on the order of ten microseconds while the setup and verification steps of FIG. 4A typically consume a total of about one microsecond, and erase step 54 typically requires on the order of tens of milliseconds while the setup and verification steps of FIG. 4B typically consume a total of about one microsecond). Thus, an undesirable consequence of operating a nonvolatile memory chip while ignoring any illegal condition that occurs (and without generating any halt signal) during a high voltage mode is that the chip could not generate a halt signal during almost the entire duration of an erase operation. As a result, the chip would almost always fail to halt an erase operation despite the occurrence of an illegal condition during the erase operation, and it would thus be impractical to operate the chip in this manner.

Until the present invention, it had not been known to design or operate a nonvolatile memory chip so that the chip generates a halt signal (and responds to the halt signal) each time an illegal condition has occurred (whether or not the illegal condition has occurred during a high voltage mode) while also avoiding the described snap back bipolar effect problem.

SUMMARY OF THE INVENTION

In one class of embodiments, the invention is a method for operating a nonvolatile memory chip, including the steps of monitoring one or more nodes of the chip to identify an illegal condition, and asserting a halt signal in response to the illegal condition. If an illegal condition is identified during high voltage mode of the chip, assertion of the halt signal is delayed until the end of the high voltage mode. If the illegal condition is identified at a time other than during a high voltage mode, assertion of the halt signal is not delayed. In response to the halt signal, the chip halts an operation (such as a memory cell erase operation). Because no halt signal is asserted during a high voltage mode, the invention avoids problems (e.g., due to the snap back bipolar effect) which could otherwise result if the chip halted an operation with high voltage applied across terminals of one or more transistors of the chip).

In other embodiments, the invention is an integrated nonvolatile memory chip that includes means for performing the inventive method. In preferred embodiments, each memory cell of the inventive memory chip is a flash memory cell.

The integrated memory circuit of the invention includes halt signal means for asserting a halt signal in response to a first signal indicating that an illegal condition of the chip has occurred, a second signal indicating that the chip is in a low voltage mode, and optionally also a third signal (e.g., a write enable signal) for resetting the halt signal means. In preferred embodiments, the halt signal means is implemented as a simple logic circuit including a flip-flop circuit. After being reset to a first state, the flip-flop remains in the first state for as long as the first signal indicates no illegal condition, but it enters a second state in response to the first signal indicating an illegal condition of the chip. The flip-flop then remains in the second state until it is reset. The logic circuit of the invention outputs a halt signal only when both the following conditions occur: the flip-flop is in the second state; and the second signal indicates that the chip is in a low voltage mode.

DETAILED DESCRIPTION OF THE INVENTION

A preferred embodiment of the inventive apparatus (and the inventive method performed thereby) will be described with reference to FIGS. 6 and 7. This embodiment is a memory chip (identified by reference numeral 3') which includes a nonvolatile memory array 16, and a control unit 29' which controls operation of chip 3' in accordance with the invention.

Figure 6:
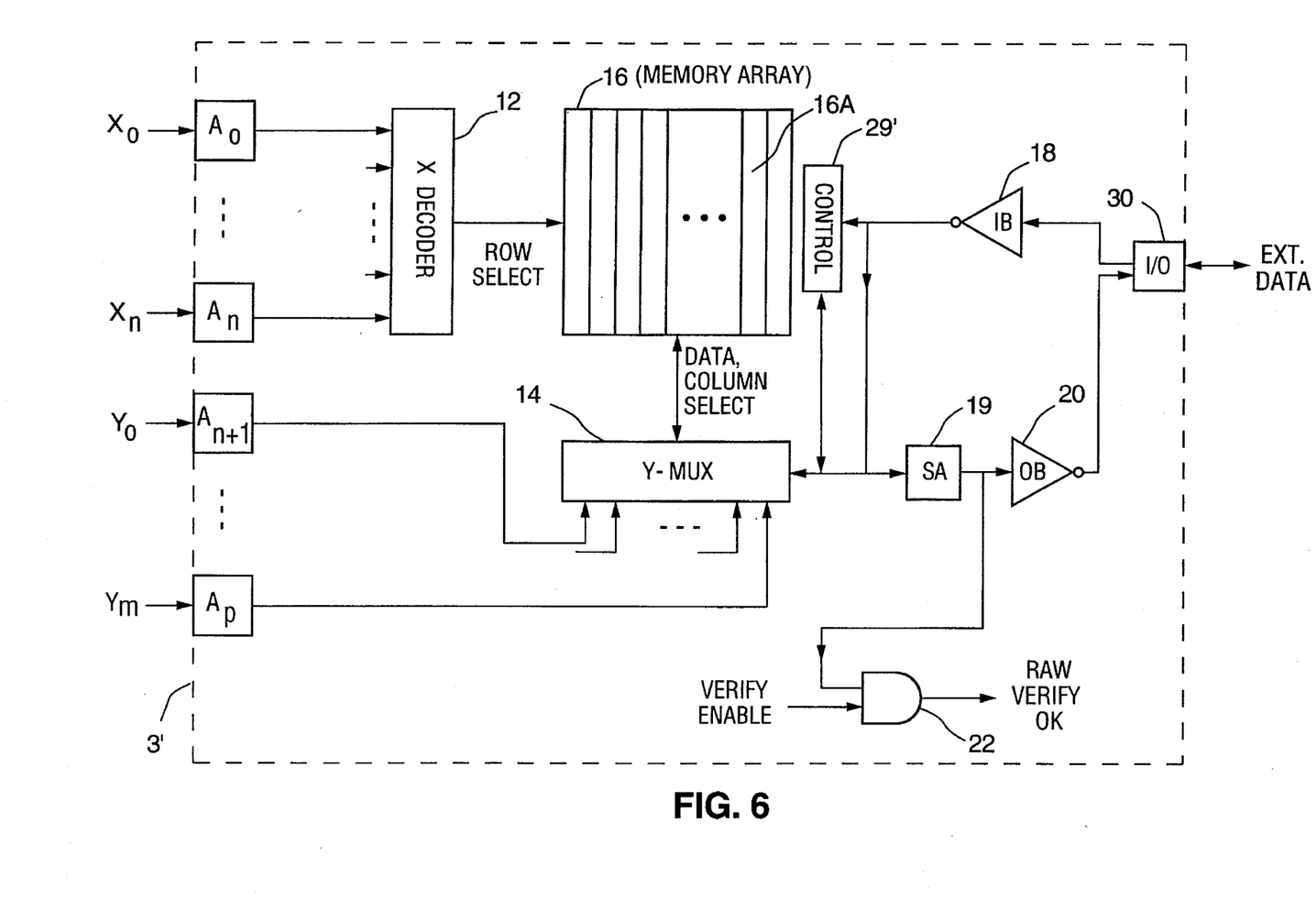
FIG. 6 is a block diagram of a memory circuit (implemented as an integrated circuit) which embodies the present invention.

Memory chip 3' of FIG. 6 is identical to conventional memory chip 3 of FIG. 1 except in that chip 3' includes control unit 29' (rather than control unit 29 of FIG. 1). Only control unit 29' (and the method implemented by chip 3' under control of unit 29') will be described below, since the foregoing description of those elements of chip 3 (of FIG. 1) other than the control unit and of the operation of chip 3 (other than its halt signal generation method) applies equally well to chip 3', and no purpose would be served by repeating it below. It is contemplated that in preferred embodiments of the invention, each nonvolatile memory cell in each memory array (e.g., each cell of nonvolatile array 16 of chip 3') is a flash memory cell.

Figure 7:
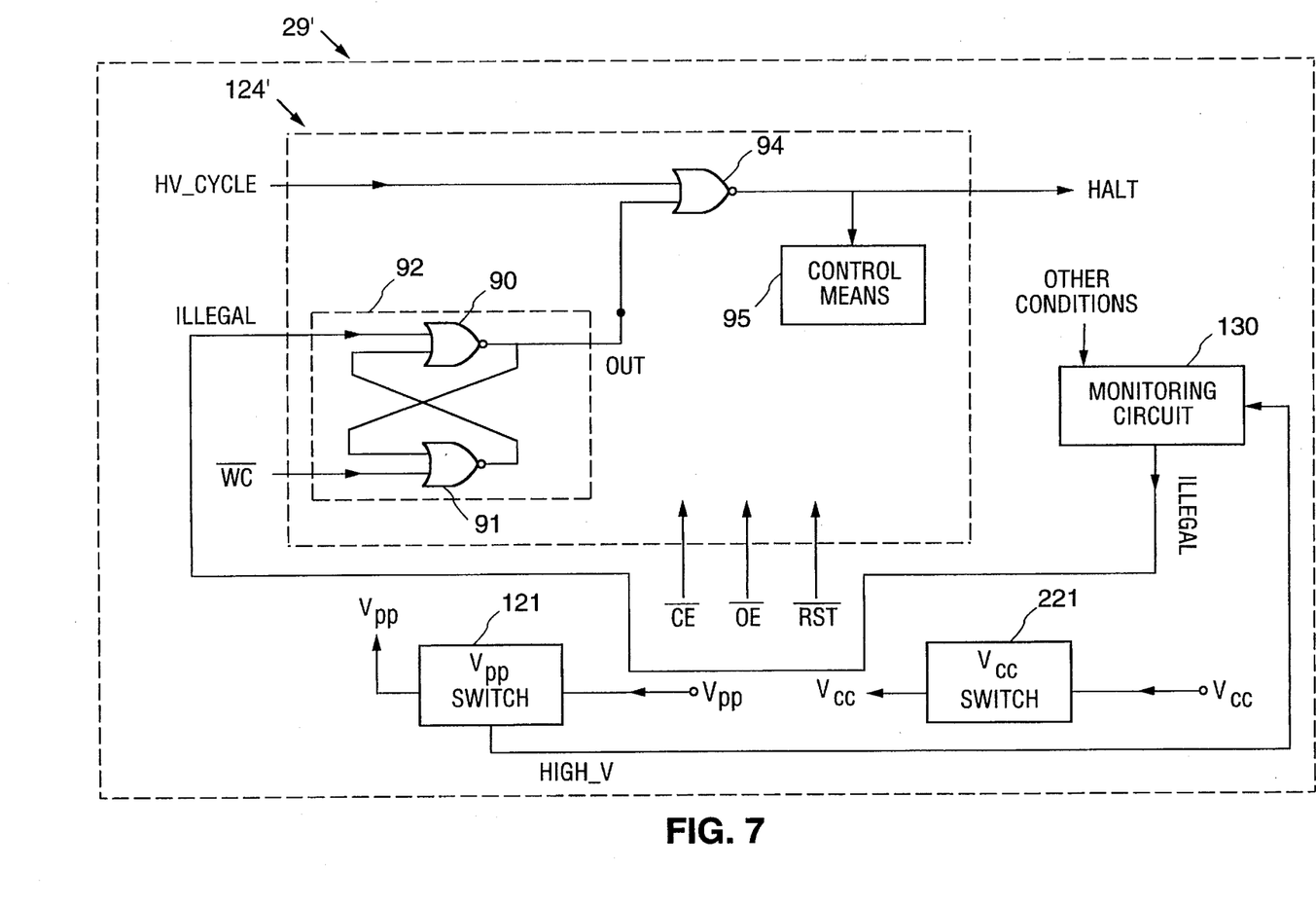
FIG. 7 is a block diagram of a portion of control unit 29' of FIG. 6.

As shown in FIG. 7, unit 29' of chip 3' preferably includes Vpp switch 121 (preferably identical to switch 121 described above with reference to FIG. 3). Switch 121, when closed, provides various component circuits of chip 3' (e.g., transistors within X decoder 12) with a relatively high programming voltage (Vpp). Unit 29' also includes switch 221 which, when closed, provides various component circuits of chip 3' (e.g., transistors within X decoder 12) with a relatively low supply voltage (Vcc). In normal operation, only one of switches 121 and 221 is closed so that unit 29' provides either the relatively low voltage (Vcc) or the relatively high voltage (Vpp) to one or more transistors of chip 3'. The high voltage (Vpp) is typically +12 volts, and low voltage (Vcc) is typically +5.0 or +5.5 volts. When the high voltage (Vpp) is applied to a transistor within chip 3' (e.g., when the source and drain of a PMOS transistor within X decoder 12 are connected between vpp and ground), the transistor is vulnerable to the undesirable "snap back bipolar" effect described above.

Figure 5:
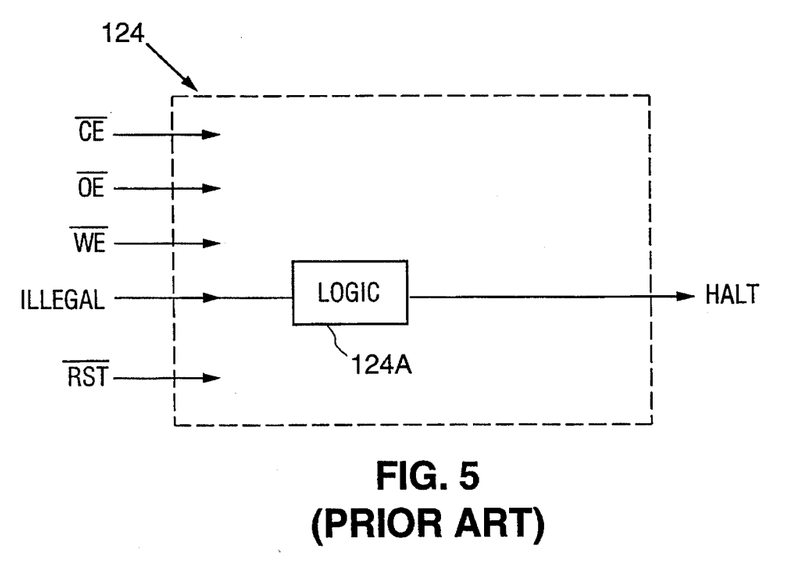
FIG. 5 is a block diagram of a portion of command execution logic 124 of FIG. 3.

Control unit 29' of chip 3' (of FIG. 6) differs from control unit 29 of FIG. 3 by including a command execution logic unit 124' comprising a halt signal means embodying the invention (e.g., the halt signal means comprising elements 92 and 94 of FIG. 7) rather than a command execution logic means (element 124 of FIGS. 3 and 5) including a conventional halt signal means (logic circuitry 124A of FIG. 5).

Although the inventive halt signal means within control unit 29' can be implemented in a variety of ways (including in software or firmware), it is preferably implemented in hardware as a simple logic circuit such as that shown in FIG. 7. The FIG. 7 embodiment of the inventive halt signal means includes flip-flop circuit 92 (consisting of NOR gates 90 and 91 connected as shown) and NOR gate 94. NOR gate 94 has a first input which receives signal "HV CYCLE" and a second input which receives the output of flip-flop 92. NOR gate 94 asserts a signal "HALT" at its output terminal. Chip 3' responds to a high level of signal "HALT" (a "halt signal") by halting or aborting an operation (such as a memory erase operation) that it is executing at the time of assertion of the halt signal. For example, control means 95 (which can be logic circuitry) within command execution logic 124' can trigger a halt of an operation of chip 3' in response to a high level of signal HALT, or components of chip 3' can respond directly to such high level of signal HALT by entering states which effectively halt such a chip operation.

With reference to FIG. 7, when switch 121 of control unit 29' is closed (and provides high voltage Vpp to components of chip 3'), signal "High V" output from switch 121 is at a high (logical "one") level. Otherwise, the signal "High V" output from switch 121 is at a low (logical "zero") level.

The signal ILLEGAL provided to one input of NOR gate 90 is generated in a conventional monitoring circuit 130 (which can, but need not, be a part of logic circuitry 124' of chip 3' as shown) which monitors the status of one or more nodes of chip 3'. Circuit 130 typically receives many signals indicative of conditions of chip 3'. As an example of such signals, FIG. 7 shows that circuit 130 receives the signal "High V" from switch 121. In response to detecting an illegal condition (as defined above), monitoring circuit 130 causes the signal "ILLEGAL" to have a high level (a logical "one"). In the absence of an illegal condition, the signal "ILLEGAL" is at a low level (a logical "zero"). For example, circuit 130 asserts a high level of signal ILLEGAL upon determining that the value of signal "High V" (received from switch 121) indicates that switch 121 is not providing high voltage Vpp to components of chip 3' at a time when signal "HV CYCLE" (or another signal provided to circuit 130 from the state machine, for example) indicates that switch 121 should be providing such high voltage to the components.

Signal "HV CYCLE" is generated by the state machine (not shown) within control unit 29', and indicates whether chip 3' should be operating in a high voltage mode. For example, "HV CYCLE" is at a high (logical "one") level when chip 3' executes steps 36 and 54 of the erase operation of FIGS. 4A and 4B (the state machine causes chip 3' to operate in a high voltage mode during these steps), but "HV CYCLE" is at a low (logical "zero") level during other steps of the erase operation in which the state machine causes chip 3' to operate in a low voltage mode.

With reference again to FIG. 7, a write cycle signal (denoted as "−WC") is provided to one input of NOR gate 91. Signal −WC (generated by means, not shown in FIG. 7, within control unit 29') has a "low" level during each "write" operation of chip 3' in which all or selected ones of the memory cells of array 16 are erased or programmed. Signal −WC is at a high logic level (i.e., a logical "1") prior to the start of a write operation (which resets flip-flop 92), and then typically goes to a "low" logic level at the start of the write operation.

In alternative embodiments, a monitoring circuit generates a variation on the signal "ILLEGAL" which has a value other than an amplitude indicating a logical one (e.g., a distinctive frequency or phase) when an illegal condition exists, and some value other than an amplitude indicating a logical zero (e.g., a distinctive frequency or phase) in the absence of such illegal condition.

We next describe the manner in which the FIG. 7 embodiment of command execution logic 124' (as included within chip 3'), and the halt signal means thereof, operates in accordance with the invention. To reset flip-flop 92, circuit 130 is controlled to hold the signal ILLEGAL at a low level (a logical "zero"), while the signal −WC is at a high logic level. After flip-flop 92 has been reset, −WC typically goes to its "low" state (when chip 3' enters a write cycle in which it erases or programs all or selected ones of the memory cells of array 16). In response to the high level of −WC (while ILLEGAL is low), the output of flip-flop 92 (the signal labeled "OUT" in FIG. 7) is reset to a "high" value (a logical "one"). This occurs since the high level of −WC causes the output of NOR gate 91 (signal "OUT") to go low, in turn causing the output of NOR gate 90 to go high. When the flip-flop has been so reset, the output of NOR gate 90 remains high after a high-to-low transition of −WC (since the output of NOR gate 91 remains low), as long as ILLEGAL remains low.

The state of flip-flop 92 when the output of NOR gate 90 is high is denoted herein as its "first" state. When flip-flop 92 has been reset (while it remains in its first state), the level of signal HALT at the output of NOR gate 94 remains "low" regardless of the level of signal HV CYCLE at the first input of NOR gate 94.

After flip-flop 92 has been reset, the circuitry which generates signal "ILLEGAL" (e.g., circuit 130) monitors one or more selected nodes of chip 3'. For as long as no illegal condition is detected by the monitoring circuitry, signal ILLEGAL remains low and the signal "OUT" at the output of flip-flop 92 remains high (regardless of the level of −WC) and thus, HALT remains low. However, if the circuitry which generates signal "ILLEGAL" detects an illegal condition, signal ILLEGAL goes high and the signal "OUT" at the output of flip-flop 92 goes low (as long as ILLEGAL remains high). We denote the state of flip-flop 92 when signal "OUT" is low as the "second" state of flip-flop 92. Even if ILLEGAL returns to a low level after going high, signal "OUT" remains low (as long as −WC remains low). However, if ILLEGAL returns to a low level after going high and −WC also goes high (i.e., at the end of a write cycle), signal "OUT" goes high.

As noted, the signal HALT output from NOR gate 94 is low immediately after flip-flop 92 is reset (regardless of the level of signal "HV CYCLE," since signal "OUT" received at one input of circuit 94 from circuit 92 is high immediately after flip-flop 92 is reset). After circuit 92 has been reset, if OUT goes low (in response to detection of an illegal condition which in turn has caused ILLEGAL to go high), the value of HALT depends on the level of signal "HV CYCLE." If OUT goes low while HV CYCLE is low, signal "HALT" quickly goes high (and in response, control unit 29' quickly halts the operation being executed by chip 3').

If on the other hand, after circuit 92 has been reset, OUT (received at circuit 94 from circuit 92) goes low while HV CYCLE is high, signal HALT does not immediately go high (and thus control unit 29' does not halt the operation being executed by chip 3' while HV CYCLE is high, thereby avoiding problems due to the above-mentioned snap back bipolar effect). It is not until after HV CYCLE goes low (while OUT remains low) that HALT goes high (causing control unit 29' to halt the operation being executed by chip 3'). Thus, in typical operation, the halt signal generation logic within circuitry 124' delays assertion of signal HALT (in response to signal ILLEGAL indicating an illegal condition) until promptly after chip 3' leaves any high voltage mode in which it happens to be (as indicated by a high-to-low transition of HV CYCLE) when the illegal condition occurs.

There is one set of conditions under which circuit 124' (of FIG. 7) would not assert signal HALT at all in response to signal ILLEGAL going high (indicating an illegal condition) while HV CYCLE is high. This set of conditions (which resets flip-flop 92 before the chip leaves the high voltage mode) is as follows: ILLEGAL returns to a low level (after going high) and signal −WC is high at the same time ILLEGAL is low, before chip 3' leaves the high voltage mode (i.e., before a high-to-low transition of HV CYCLE). However, this situation cannot normally occur since if HV CYCLE is high, the chip must be executing a write operation (in which memory cells are programmed or erased), and thus −WC would not be high at such a time.

It is contemplated that numerous variations on the halt signal means (comprising elements 92 and 94) within command execution logic 124' of FIG. 7 can be designed to implement the method of the invention. For example, the halt signal means can be designed to implement logic for asserting the signal HALT in all cases in response to a low-to-high transition of signal ILLEGAL while signal HV CYCLE is low, and in all cases in response to a high-to-low transition of signal HV CYCLE following a low-to-high transition of signal ILLEGAL while HV CYCLE is high. Alternatively, the halt signal means can be designed to implement logic for asserting signal HALT (except under special conditions) in response to a low-to-high transition of signal ILLEGAL while signal HV CYCLE is low, and (except under special conditions) in response to a high-to-low transition of signal HV CYCLE following a low-to-high transition of signal ILLEGAL while HV CYCLE is high.

A preferred embodiment of the invention, and several variations thereon, have been described with reference to FIGS. 6 and 7. Although the embodiment of FIGS. 6 and 7 has been described in some detail, it is contemplated that changes from any of these embodiments can be made without departing from the spirit and scope of the invention as defined by the appended claims.

What is claimed is:

1. An integrated memory circuit operable in a selected one of a high voltage mode and a low voltage mode, including:

first means for monitoring status of the memory circuit during an operation of said memory circuit to identify a condition of the memory circuit that requires termination of said operation and asserting a status signal having a first value in response to presence of said condition;

second means for terminating said operation in response to a halt signal; and halt signal means for receiving the status signal from the first means, generating the halt signal in response to the first value of the status signal, and asserting the halt signal to the second means regardless of whether said condition continues to be present but only during the low voltage mode.

2. An integrated memory circuit operable in a selected one of a high voltage mode and a low voltage mode, including:

first means for monitoring status of the memory circuit during an operation of said memory circuit to identify a condition of the memory circuit that requires termination of said operation and asserting a status signal having a first value in response to presence of said condition;

second means for terminating said operation in response to a halt signal; and halt signal means for receiving the status signal from the first means, generating the halt signal in response to the first value of the status signal, and asserting the halt signal to the second means regardless of whether said condition continues to be present but only during the low voltage mode, wherein the memory circuit operates in the low voltage mode after operating in the high voltage mode, and wherein the halt signal means includes:

means for delaying assertion of the halt signal to the second means until the low voltage mode, in response to receiving the status signal with said first value during the high voltage mode.

3. An integrated memory circuit operable in a selected one of a high voltage mode and a low voltage mode, including:

first means for monitoring status of the memory circuit during an operation of said memory circuit to identify a condition of the memory circuit that requires termination of said operation and asserting a status signal having a first value in response to presence of said condition;

second means for terminating said operation in response to a halt signal; and halt signal means for receiving the status signal from the first means, generating the halt signal in response to the first value of the status signal, and asserting the halt signal to the second means regardless of whether said condition continues to be present but only during the low voltage mode, wherein the halt signal means is a logic circuit, and the logic circuit includes:

a flip-flop circuit having a first input which receives the status signal and an output, wherein the flip-flop circuit enters a first state upon being reset, undergoes a transition from the first state to a second state in response to said first value of the status signal, and asserts an output signal at the output while in the second state; and a second circuit having an output, a first input which receives the output signal from the flip-flop circuit, and a second input which receives a second signal, wherein a value of the second signal indicates that the memory circuit is in the low voltage mode, and wherein the second circuit asserts the halt signal at its output only in response to assertion of the output signal at its first input while the second signal having said value is asserted at its second input.

4. The memory circuit of claim 3, also including:

means for resetting the flip-flop circuit to the first state by asserting a third signal to a second input of the flip-flop circuit, while the status signal asserted to the first input of the flip-flop circuit has a value other than said first value.

5. The memory circuit of claim 3, wherein the flip-flop circuit, after entering the second state, remains in said second state until it is reset to the first state.

6. The memory circuit of claim 1, wherein the memory circuit is an integrated nonvolatile memory circuit, and also including:

an array of nonvolatile memory cells; and means for executing an erase operation in which at least some of the cells are erased, wherein the memory circuit operates in the high voltage mode during a portion of the erase operation and in the low voltage mode during another portion of the erase operation, and wherein the second means halts said erase operation in response to the halt signal but only during the low voltage mode.

7. The memory circuit of claim 6, wherein each of the memory cells is a flash memory cell.

8. An integrated nonvolatile memory circuit, including:

an array of nonvolatile memory cells;

means for executing an erase operation in which at least some of the cells are erased, wherein the memory circuit operates in a high voltage mode during a portion of the erase operation and in a low voltage mode during another portion of the erase operation;

first means for monitoring status of the memory circuit during the erase operation to identify a condition of the memory circuit that requires termination of said erase operation and asserting a status signal having a first value in response to presence of the condition;

second means for halting the erase operation in response to a halt signal; and halt signal means for receiving the status signal from the first means, generating the halt signal in response to the first value of the status signal, and asserting the halt signal to the second means regardless of whether said condition continues to be present but only during the low voltage mode.

9. The memory circuit of claim 8, wherein each of the memory cells is a flash memory cell.

10. An integrated nonvolatile memory circuit, including;

an array of nonvolatile memory cells;

means for executing an erase operation in which at least some of the cells are erased, wherein the memory circuit operates in a high voltage mode during a portion of the erase operation and in a low voltage mode during another portion of the erase operation;

first means for monitoring status of the memory circuit during the erase operation to identify a condition of the memory circuit that requires termination of said erase operation and asserting a status signal having a first value in response to presence of the condition;

second means for halting the erase operation in response to a halt signal; and halt signal means for receiving the status signal from the first means, generating the halt signal in response to the first value of the status signal, and asserting the halt signal to the second means regardless of whether said condition continues to be present but only during the low voltage mode, wherein the memory circuit operates in the low voltage mode after operating in the high voltage mode, and wherein the halt signal means includes:

means for delaying assertion of the halt signal to the second means until the low voltage mode, in response to receiving the status signal with said first value during the high voltage mode.

11. An integrated nonvolatile memory circuit, including:

an array of nonvolatile memory cells;

means for executing an erase operation in which at least some of the cells are erased, wherein the memory circuit operates in a high voltage mode during a portion of the erase operation and in a low voltage mode during another portion of the erase operation;

first means for monitoring status of the memory circuit during the erase operation to identify a condition of the memory circuit that requires termination of said erase operation and asserting a status signal having a first value in response to presence of the condition;

second means for halting the erase operation in response to a halt signal; and halt signal means for receiving the status signal from the first means, generating the halt signal in response to the first value of the status signal, and asserting the halt signal to the second means regardless of whether said condition continues to be present but only during the low voltage mode, wherein the halt signal means is a logic circuit, and the logic circuit includes:

a flip-flop circuit having a first input and an output, wherein the first input receives the status signal, and wherein the flip-flop circuit enters a first state upon being reset, undergoes a transition from the first state to a second state in response to said first value of the status signal, and asserts an output signal at the output while in the second state; and a gate circuit having an output, a first input which receives the output signal from the flip-flop circuit, and a second input which receives a second signal, wherein a value of the second signal indicates that the memory circuit is in the low voltage mode, and wherein the gate circuit asserts the halt signal at its output only in response to assertion of the output signal at its first input while the second signal having said value is asserted at its second input.

12. The memory circuit of claim 11, wherein the gate circuit is a NOR gate.

13. A method for operating an integrated memory circuit, including the steps of:

(a) monitoring status of the memory circuit during an operation to identify a condition of the memory circuit that requires termination of the operation, wherein a portion of the operation is a high voltage mode and another portion of the operation is a low voltage mode, and asserting a status signal having a first value in response to presence of the condition;

(b) asserting a halt signal in response to assertion of the status signal with said first value regardless of whether said condition continues to be present, but only during the low voltage mode; and (c) halting said operation in response to the halt signal.

14. A method for operating an integrated memory circuit, including the steps of:

(a) monitoring status of the memory circuit during an operation to identify a condition of the memory circuit that requires termination of the operation, wherein a portion of the operation is a hiqh voltage mode and another portion of the operation is a low voltage mode, and asserting a status signal having a first value in response to presence of the condition;

(b) asserting a halt signal in response to assertion of the status signal with said first value regardless of whether said condition continues to be present, but only during the low voltage mode; and (c) halting said operation in response to the halt signal, wherein the operation includes a repeating sequence of low voltage modes and high voltage modes, and wherein step (b) includes the step of:

delaying assertion of the halt signal until one of said low voltage modes, in response to assertion of the status signal with said first value during one of said high voltage modes.

15. A method for operating an integrated memory circuit, including the steps of:

(a) monitoring status of the memory circuit during an operation to identify a condition of the memory circuit that requires termination of the operation, wherein a portion of the operation is a high voltage mode and another portion of the operation is a low voltage mode, and asserting a status signal having a first value in response to presence of the condition;

(b) asserting a halt signal in response to assertion of the status signal with said first value regardless of whether said condition continues to be present, but only during the low voltage mode; and (c) halting said operation in response to the halt signal, wherein the memory circuit includes a logic circuit comprising a flip-flop circuit and a gate circuit, the flip-flop circuit has an input and an output, the gate circuit has a first input connected to the output of the flip-flop circuit and a second input which receives a second signal, and a value of the second signal indicates that the memory circuit is in the low voltage mode, and wherein step (b) includes the steps of:

(d) resetting the flip-flop circuit to a first state;

(e) after step (d), asserting the status signal to the input of the flip-flop circuit, thereby causing the flip-flop circuit to undergo a transition from the first state to a second state, wherein the flip-flop circuit asserts an output signal at the output while in the second state; and (f) asserting the halt signal at the output of the gate circuit in response to assertion of the output signal at the first input of the gate circuit and assertion of the second signal with said value at the second input of the gate circuit.

16. The method of claim 13, wherein said operation of the memory circuit is an erase operation.

17. A method for operating an integrated nonvolatile memory circuit including an array of nonvolatile memory cells, said method including the steps of:

(a) monitoring status of the memory circuit during an erase operation in which at least some of the memory cells are erased, to identify a condition of the memory circuit that requires termination of said erase operation, and asserting a status signal having a first value in response to presence of an illegal condition, wherein a portion of the erase operation is a high voltage mode and another portion of the erase operation is a low voltage mode;

(b) asserting a halt signal in response to assertion of the status signal with said first value regardless of whether said condition continues to be present, but only during the low voltage mode; and (c) halting the erase operation in response to the halt signal.

18. The method of claim 17, wherein the erase operation includes a repeating sequence of low voltage modes and high voltage modes, and wherein step (b) includes the step of:

delaying assertion of the halt signal until one of said low voltage modes, in response to assertion of the status signal with said first value during one of said high voltage modes.

19. The method of claim 17, wherein the memory circuit includes a logic circuit comprising a flip-flop circuit and a gate circuit, the flip-flop circuit has an input and an output and the gate circuit has a first input connected to the output of the flip-flop circuit and a second input which receives a second signal, and a value of the second signal indicates that the memory circuit is in the low voltage mode, and wherein step (b) includes the steps of:

(d) resetting the flip-flop circuit to a first state;

(e) after step (d), asserting the status signal to the input of the flip-flop circuit, thereby causing the flip-flop circuit to undergo a transition from the first state to a second state, wherein the flip-flop circuit asserts an output signal at the output while in the second state; and (f) asserting the halt signal at the output of the gate circuit in response to assertion of the output signal at the first input of the gate circuit and assertion of the second signal with said value at the second input of the gate circuit.

* * * * *